(12) United States Patent
Tsutsui et al.

(10) Patent No.: US 8,957,151 B2
(45) Date of Patent: Feb. 17, 2015

(54) LIQUID-REPELLENT FILM AND PRODUCTION METHOD THEREFOR, AND FINE STRUCTURE USING THE LIQUID-REPELLENT FILM AND PRODUCTION METHOD THEREFOR

(71) Applicant: Canon Kabushiki Kaisha, Tokyo (JP)

(72) Inventors: Satoshi Tsutsui, Yokohama (JP); Etsuko Sawada, Tokyo (JP); Hiroaki Mihara, Machida (JP); Yohei Hamade, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 144 days.

(21) Appl. No.: 13/758,180

(22) Filed: Feb. 4, 2013

(65) Prior Publication Data

US 2013/0216958 A1    Aug. 22, 2013

(30) Foreign Application Priority Data

Feb. 17, 2012   (JP) ................................. 2012-032687

(51) Int. Cl.
*C08L 83/00* (2006.01)
*G03F 7/11* (2006.01)

(52) U.S. Cl.
CPC ...................................... *G03F 7/11* (2013.01)
USPC .......................................................... 524/506

(58) Field of Classification Search
USPC .......................................... 524/506; 428/421
See application file for complete search history.

(56) References Cited

FOREIGN PATENT DOCUMENTS

JP         2010-23525 A     2/2010

*Primary Examiner* — Brittany Raymond
(74) *Attorney, Agent, or Firm* — Fitzpatrick, Cella, Harper & Scinto

(57) ABSTRACT

Provided are a liquid-repellent film in which the aggregation of a liquid-repellent material is suppressed and which is excellent in liquid-repellent properties and a production method therefor, and a fine structure using the liquid-repellent film and a production method therefor. The liquid-repellent film is a liquid-repellent film formed of a silane compound having a specific perfluoropolyether group and a fluorine-containing acrylic homopolymer.

7 Claims, 2 Drawing Sheets

LIQUID-REPELLENT FILM AND PRODUCTION METHOD THEREFOR, AND FINE STRUCTURE USING THE LIQUID-REPELLENT FILM AND PRODUCTION METHOD THEREFOR

BACKGROUND OF THE INVENTION

1. Field of the Invention

The present invention relates to a liquid-repellent film that may be used in a fine structure included in an ink jet recording head or the like and a production method therefor, and to a fine structure using the liquid-repellent film and a production method therefor.

2. Description of the Related Art

In recent years, a liquid-repellent material (e.g., a water-repellent material) has been applied to various devices such as an integrated circuit, a display, a biochip, a battery, and an ink jet recording head. In the ink jet recording head, control of surface characteristics of the surface of an ejection orifice is important for obtaining satisfactory ink ejection performance. When ink remains in the vicinity of the ejection orifice, the flying direction of an ink droplet may be deflected, or a load may be applied to an ink droplet to be ejected to reduce the ejection speed of the ink droplet. As a method of ejecting ink with good precision by alleviating those problems, there is given a method involving subjecting an area around the ejection orifice to liquid-repellent processing.

Further, in order to densely arrange ejection orifices, a method involving employing photolithography for forming a member on which the ejection orifices are provided is useful. Japanese Patent Application Laid-Open No. 2010-23525 discloses that as a liquid-repellent material having photosensitivity, a condensation product of a hydrolyzable silane compound having a fluorine-containing group and a hydrolyzable silane compound having a cationic polymerizable group is used. In Japanese Patent Application Laid-Open No. 2010-23525, with the use of the liquid-repellent material, a liquid-repellent layer and a member on which ejection orifices are formed are simultaneously subjected to pattern exposure and development, to thereby subject an ejection orifice surface to liquid repelling processing.

SUMMARY OF THE INVENTION

A liquid-repellent film of the present invention is a liquid-repellent film including: any one of silane compounds having a perfluoropolyether group represented by the following formulae (1), (2), and (3); and a fluorine-containing acrylic homopolymer which is a homopolymerized product of a monomer represented by the following formula (4).

Further, a liquid-repellent film of the present invention is a liquid-repellent film including: any one of silane compounds having a perfluoropolyether group represented by the following formulae (1), (2), and (3); and a fluorine-containing acrylic copolymer which is a copolymerized product of a monomer represented by the following formula (4) and a monomer represented by the following formula (5).

$$Rf^{I}-X^{I}-SiR^{I}_{a}Y^{I}_{3-a} \quad \text{Formula (1)}$$

(In the formula (1), $Rf^{I}$ represents a perfluoropolyether group, $R^{I}$ represents a hydrolyzable substituent, $X^{I}$ represents an organic group having 1 or more and 12 or less carbon atoms, $Y^{I}$ represents a non-hydrolyzable substituent, and a represents an integer of 1 or more and 3 or less.)

$$Y^{II}_{3-b}R^{II}_{b}Si-X^{II}-Rf^{II}-X^{III}-SiR^{III}_{c}Y^{III}_{3-c} \quad \text{Formula (2)}$$

(In the formula (2), $Rf^{II}$ represents a perfluoropolyether group, $R^{II}$ and $R^{III}$ each independently represent a hydrolyzable substituent, $X^{II}$ and $X^{III}$ each independently represent an organic group having 1 or more and 12 or less carbon atoms, $Y^{II}$ and $Y^{III}$ each independently represent a non-hydrolyzable substituent, and b and c each independently represent an integer of 1 or more and 3 or less.)

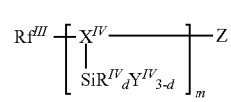

Formula (3)

(In the formula (3), $Rf^{III}$ represents a perfluoropolyether group, $R^{IV}$ represents a hydrolyzable substituent, $X^{IV}$ represents a linear saturated hydrocarbon group having 1 or more and 12 or less carbon atoms, $Y^{IV}$ represents a non-hydrolyzable substituent, Z represents a hydrogen atom or an alkyl group, d represents an integer of 1 or more and 3 or less, and m represents a positive integer, provided that $-SiR^{IV}_{d}Y^{IV}_{3-d}$ is bonded to a terminal carbon atom on a Z side in $X^{IV}$.)

$$CH_{2}=CA^{I}-C(=O)-O-A^{II}-Rf^{IV} \quad \text{Formula (4)}$$

(In the formula (4), $A^{I}$ represents H or $CH_{3}$, $A^{II}$ represents a linear saturated hydrocarbon group having 1 or more and 3 or less carbon atoms, and $Rf^{IV}$ represents a linear or branched perfluoroalkyl group.)

$$CH_{2}=CA^{III}-C(=O)-O-A^{IV} \quad \text{Formula (5)}$$

(In the formula (5), $A^{III}$ represents H or $CH_{3}$, and $A^{IV}$ represents an alkyl group having 1 or more and 30 or less carbon atoms or a group having an oxirane ring.)

Further, a production method for a liquid-repellent film of the present invention is a production method for the above-mentioned liquid-repellent film, the method including the steps of: providing a mixture containing any one of the silane compounds having a perfluoropolyether group represented by the formulae (1) to (3), and the fluorine-containing acrylic homopolymer; and providing a liquid-repellent film which is a solidified product of the mixture.

Further, a fine structure of the present invention is a fine structure to be formed on a substrate, the fine structure being characterized by including the liquid-repellent film.

Further, a production method for a fine structure of the present invention is characterized by including the steps of: forming, on a substrate, a photo cationic polymerizable resin layer which contains a photo cationic polymerizable resin material and is uncured; forming, on the photo cationic polymerizable resin layer, the liquid-repellent film; and subjecting the photo cationic polymerizable resin layer and the liquid-repellent film to pattern exposure and development to remove a non-exposed portion of the photo cationic polymerizable resin layer and a non-exposed portion of the liquid-repellent film, thereby forming a fine pattern.

Further features of the present invention will become apparent from the following description of exemplary embodiments with reference to the attached drawings.

DESCRIPTION OF THE EMBODIMENTS

Figure 1:
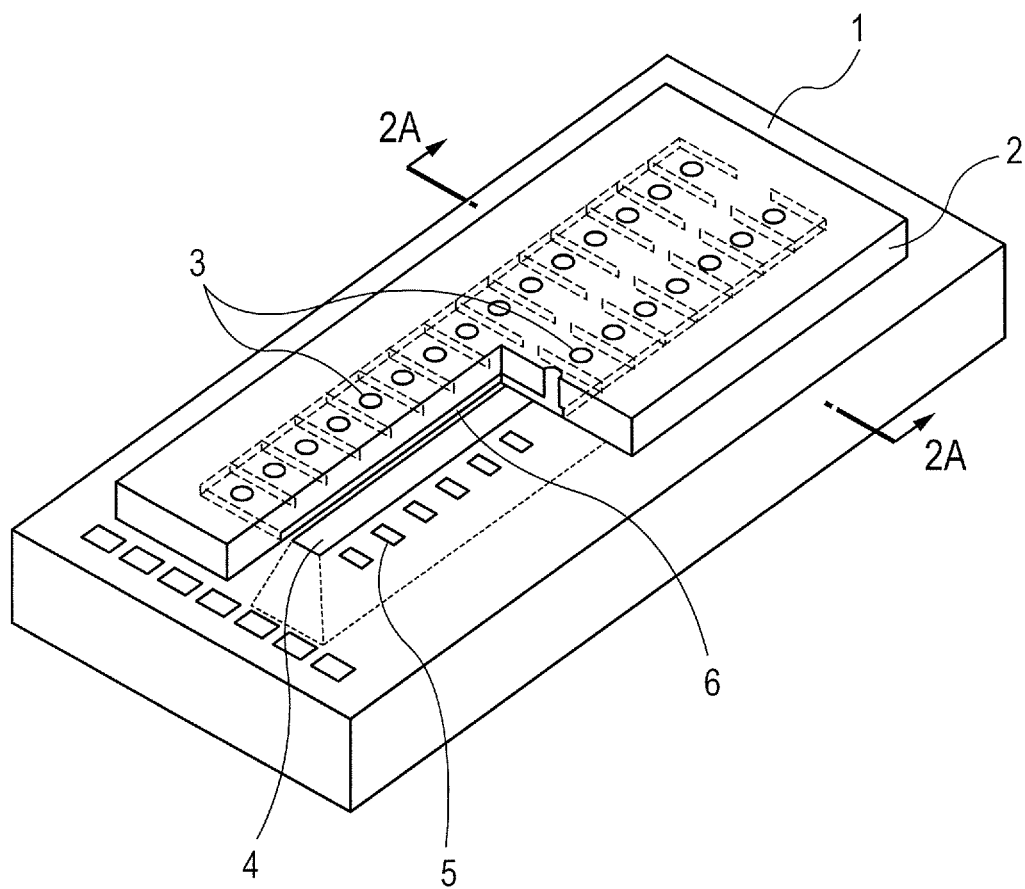
FIG. 1 is a perspective view of an example of an ink jet recording head having a fine structure of the present invention.

In general, many liquid-repellent materials each contain a fluorine element having low affinity for an organic resin. Accordingly, depending on application conditions, after the liquid-repellent materials have been applied onto, for example, the ejection orifice surface of an ink jet recording head, the aggregation of the liquid-repellent materials occurs in some cases.

An object of the present invention is to provide a liquid-repellent film in which the aggregation of a liquid-repellent material is suppressed and which is excellent in liquid-repellent properties and a production method therefor. Further, another object of the present invention is to provide a fine structure using the liquid-repellent film and a production method therefor.

<Liquid-Repellent Film>

The liquid-repellent film of the present invention is formed of a fluorine-containing acrylic homopolymer or a fluorine-containing acrylic copolymer and a silane compound having a specific perfluoropolyether group to be described later. The liquid-repellent film may be a mixture (composition) of the homopolymer or the copolymer and the silane compound. It should be noted that the liquid-repellent film is a film having liquid-repellent properties, and may be used, for example, as a liquid-repellent layer of an ink jet recording head. The liquid-repellent film of the present invention can have a contact angle (dynamic receding contact angle) with a liquid (e.g., water) of more than 90°. The contact angle of the liquid-repellent film with a liquid may be measured with an automatic contact angle meter (Kyowa Interface Science Co., Ltd., trade name: CA-W).

Silane Compound Having Perfluoropolyether Group

In the liquid-repellent film of the present invention, in order to exhibit high liquid-repellent properties, as a liquid-repellent material, there is used any one of silane compounds having a perfluoropolyether group represented by the following formulae (1) to (3). The content of the silane compound in the liquid-repellent film is preferably 10 mass % or more from the viewpoints of liquid-repellent properties, and 80 mass % or less from the viewpoints of application property and solubility.

$$Rf^{I}-X^{I}-SiR^{I}_{a}Y^{I}_{3-a} \qquad \text{Formula (1)}$$

In the formula (1), $Rf^{I}$ represents a perfluoropolyether group, $R^{I}$ represents a hydrolyzable substituent, $X^{I}$ represents an organic group having 1 or more and 12 or less carbon atoms, $Y^{I}$ represents a non-hydrolyzable substituent, and a represents an integer of 1 or more and 3 or less.

$$Y^{II}_{3-b}R^{II}_{b}Si-X^{II}-Rf^{II}-V^{III}-SIR^{III}_{c}Y^{III}_{3-c} \qquad \text{Formula (2)}$$

In the formula (2), $Rf^{II}$ represents a perfluoropolyether group, $R^{II}$ and $R^{III}$ each independently represent a hydrolyzable substituent, $X^{II}$ and $X^{III}$ each independently represent an organic group having 1 or more and 12 or less carbon atoms, $Y^{II}$ and $Y^{III}$ each independently represent a non-hydrolyzable substituent, and b and c each independently represent an integer of 1 or more and 3 or less.

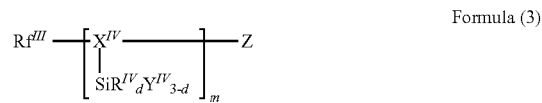

In the formula (3), $Rf^{III}$ represents a perfluoropolyether group, $R^{IV}$ represents a hydrolyzable substituent, $X^{IV}$ represents a linear saturated hydrocarbon group having 1 or more and 12 or less carbon atoms, $Y^{IV}$ represents a non-hydrolyzable substituent, Z represents a hydrogen atom or an alkyl group, d represents an integer of or more and 3 or less, and m represents a positive integer, provided that $—SiR^{IV}_{d}Y^{IV}_{3-d}$ is bonded to a terminal carbon atom on a Z side in $X^{IV}$ as in a silane compound represented by a formula (8) to be described later.

It should be noted that when Z represents an alkyl group, the alkyl group is preferably set to have 1 or more and 3 or less carbon atoms from the viewpoint of solubility. The alkyl group may be linear, or may be branched. Further, m preferably represents an integer of 1 or more from the viewpoint of reactivity, and an integer of 5 or less from the viewpoint of film forming property.

Perfluoropolyether Group

The perfluoropolyether group is a functional group in which multiple perfluoroalkyl groups are bonded via oxygen atoms, and the numbers of carbon atoms of the perfluoroalkyl groups may be, for example, 1 or more and 3 or less. The perfluoropolyether group in the formulae (1) to (3) may have, for example, a structure represented by the following formula (7), or alternatively may have, for example, a $—CF(CF_3)O—$ structure or a $—C(CF_3)_2O—$ structure. Further, the perfluoropolyether group in the formulae (1) to (3) may be a group represented by the following formula (7).

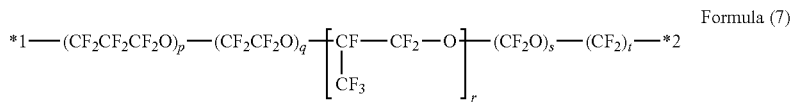

In the formula (7), p, q, r, s, and t each independently represent an integer of 0 or more, provided that the sum of p, q, r, and s is 2 or more. It should be noted that the sum of p, q, r, and s is preferably 50 or less from the viewpoint of solubility, and t preferably represents 7 or less from the viewpoint of an environmental burden because a long-chain perfluoroalkyl group-containing compound having 8 or more carbon atoms tends to be hardly decomposable.

Further, *1 and *2 each independently represent a fluorine atom, or represent a bonding site with the organic group having 1 or more and 12 or less carbon atoms or the linear saturated hydrocarbon group having 1 or more and 12 or less carbon atoms, provided that at least one of *1 and *2 represents a bonding site with the organic group having or more and 12 or less carbon atoms or the linear saturated hydrocarbon group having 1 or more and 12 or less carbon atoms.

It should be noted that when $Rf^{I}$ in the formula (1) represents the perfluoropolyether group represented by the formula (7), either one of *1 and *2 in the formula (7) represents a fluorine atom, and the other represents a bonding site with $X^{I}$ in the formula (1). When $Rf^{III}$ in the formula (3) represents the perfluoropolyether group represented by the formula (7), either one of *1 and *2 in the formula (7) represents a fluorine atom, and the other represents a bonding site with $X^{IV}$ in the formula (3). When $Rf^{II}$ in the formula (2) represents the perfluoropolyether group represented by the formula (7), either one of *1 and *2 in the formula (7) represents a bonding site with $X^{II}$ in the formula (2), and the other represents a bonding site with $X^{III}$. That is, $X^{II}$ in the formula (2) may be bonded to either one of *1 and *2 in the formula (7).

The weight-average molecular weight of the perfluoropolyether group in the silane compound having a perfluoropolyether group contained in the liquid-repellent film is preferably 500 or more and 20,000 or less, more preferably 1,000 or more and 10,000 or less. When the weight-average molecular weight is 500 or more, liquid-repellent properties can be easily expressed. Further, when the weight-average molecular weight is 20,000 or less, a reduction in solubility in a solvent can be more certainly suppressed. It should be noted that when the perfluoropolyether group is represented by the formula (7), the weight-average molecular weight of the perfluoropolyether group is the weight-average molecular weight of total repeating units taking p to t in the formula (7) into account. It should be noted that when the perfluoropolyether group is a terminal group as in the formula (1) or (3), the fluorine atom represented by *1 or *2 is also included in the weight-average molecular weight of the perfluoropolyether group. The weight-average molecular weight of the perfluoropolyether group may be identified by using gel permeation chromatography (GPC).

Hydrolyzable Substituent

The hydrolyzable substituent in the formulae (1) to (3) is a group that can be hydrolyzed in the presence of an acidic catalyst such as hydrochloric acid or a basic catalyst such as sodium hydroxide, or in the absence of any catalyst. When the hydrolyzable substituent is hydrolyzed by heating as required, in the silane compounds represented by the formulae (1) to (3), a silanol group can be generated, and a siloxane condensate can also be formed. Specific examples of the hydrolyzable substituent may include a halogen atom, an alkoxy group, an amino group, and a hydrogen atom. Of those, an alkoxy group such as a methoxy group, an ethoxy group, or a propoxy group is preferably used as the hydrolyzable substituent from the viewpoint of reactivity control. Further, of the alkoxy groups, an alkoxy group having 1 or more and 3 or less carbon atoms is more preferably used from the viewpoint of reaction control.

Non-Hydrolyzable Substituent

Examples of the non-hydrolyzable substituent in the formulae (1) to (3) include an alkyl group having 1 or more and 20 or less carbon atoms and a phenyl group. Of those, a methyl group or an ethyl group is preferably used as the non-hydrolyzable substituent from the viewpoint of reactivity control.

Organic Group

Examples of the organic group in the formulae (1) and (2) may include an alkylene group (e.g., a linear alkylene group) that may have an ether bond. It should be noted that the organic group has 1 or more and 12 or less carbon atoms.

The liquid-repellent film of the present invention is preferably provided in a fine structure to be described later. It should be noted that when the liquid-repellent film is formed on the surface of a photo cationic polymerizable resin layer to be described later, a silane compound having a perfluoropolyether group capable of reacting with a photo cationic polymerizable resin material contained in the resin layer to form a bond is desirably used. When the silane compound reacts with the resin material to form a bond, adhesion with the photo cationic polymerizable resin layer can be maintained.

Each of the silane compounds represented by the formulae (1) to (3) to be used in the present invention has a hydrolyzable silyl group at a terminal portion thereof. Accordingly, for example, when the photo cationic polymerizable resin material has at least one functional group selected from the group consisting of a hydroxy group and an epoxy group, the hydrolyzable silyl group at the terminal portion in the silane compound can react with the functional group to form a bond. Preferred specific examples of the silane compound to be used in the present invention are given in the following chemical formulae (8) to (10). With the use of any such silane compound, adhesion with the photo cationic polymerizable resin layer can be maintained. Further, of those silane compounds, a silane compound represented by the formula (8) is particularly preferably used from the viewpoints of reactivity and liquid-repellent properties.

Formula (8)
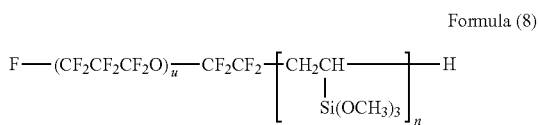

In the formula (8), u represents an integer of 3 or more and 20 or less and n represents an integer of 1 or more and 3 or less.

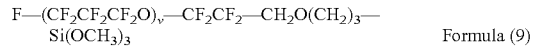

Formula (9)

In the formula (9), v represents an integer of 3 or more and 20 or less.

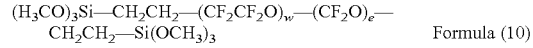

Formula (10)

In the formula (10), w represents an integer of 0 or more and 20 or less and e represents an integer of 0 or more and 30 or less, provided that the sum of w and e is 2 or more.

Fluorine-Containing Acrylic Homopolymer or Fluorine-Containing Acrylic Copolymer In the present invention, a homopolymer of a unit monomer containing a fluorine atom represented by the formula (4) (fluorine-containing acrylic homopolymer) or a copolymer of monomers represented by the formula (4) and the formula (5) (fluorine-containing acrylic copolymer) is used. Each of those organic polymers has high ability to form a coating film and may be used as a mixture with the above-mentioned silane compound having a perfluoropolyether group. With the use of the homopolymer (homopolymerized product) or the copolymer (copolymerized product), the silane compound having a perfluoropolyether group can be dispersed in the polymer to suppress its aggregation.

It should be noted that the content of the polymer (the homopolymer or the copolymer) in the liquid-repellent film is preferably set to 20 mass % or more from the viewpoint of the suppression of the aggregation of the silane compound having a perfluoropolyether group, and 90 mass % or less from the viewpoints of liquid-repellent properties.

The formula (4) is shown below.

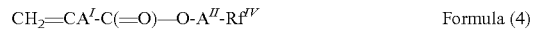

Formula (4)

In the formula (4), $A^I$ represents H or $CH_3$, $A^{II}$ represents a linear saturated hydrocarbon group having 1 or more and 3 or less carbon atoms, and $Rf^{IV}$ represents a linear or branched perfluoroalkyl group.

It should be noted that $Rf^{IV}$ represents preferably a perfluoroalkyl group having 4 or more and 6 or less carbon atoms, more preferably a perfluoroalkyl group having 6 carbon atoms (perfluorohexyl group: $C_6F_{13}$ group) from the viewpoints of liquid-repellent properties and solubility.

Preferred specific examples of the fluorine-containing acrylate monomer represented by the formula (4) are given in the following chemical formulae (11) and (12).

$$CH_2=CH-C(=O)-O-(CH_2)_2-C_6F_{13} \quad \text{Formula (11)}$$

$$CH_2=C(CH_3)-C(=O)-O-(CH_2)_2-C_6F_{13} \quad \text{Formula (12)}$$

Next, the formula (5) is shown below.

$$CH_2=CA^{III}-C(=O)-O-A^{IV} \quad \text{Formula (5)}$$

In the formula (5), $A^{III}$ represents H or $CH_3$, and $A^{IV}$ represents an alkyl group having 1 or more and 30 or less carbon atoms or a group having an oxirane ring (epoxy group). It should be noted that $A^{IV}$ preferably represents an alkyl group having 10 or more and 30 or less carbon atoms or a group having an oxirane ring from the viewpoints of coating film formability and affinity for a base coat. The group having an oxirane ring is preferably set to have 3 or more and 5 or less carbon atoms from the viewpoint of reaction control. The group having an oxirane ring may be, for example, a linear saturated hydrocarbon group having an oxirane ring.

Further, preferred specific examples of the fluorine-free acrylate monomer represented by the formula (5) are given in the following chemical formulae (13), (14), and (15).

$$CH_2=CH-C(=O)-O-(CH_2)_2-C_gH_{2g+1} \quad \text{Formula (13)}$$

In the formula (13), g represents an integer of 0 or more and 28 or less.

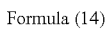

Formula (14)

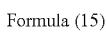

Formula (15)

It should be noted that as the homopolymer and the copolymer are obtained by polymerizing the monomers represented by the formulae (4) and (5), the monomers represented by the formulae (4) and (5) are present in the homopolymer or the copolymer as units (segments) formed from the monomers (derived from the monomers). For example, the monomer represented by the formula (11) may be present in the homopolymer or the copolymer as a monomer unit represented by the following formula (16). That is, the homopolymer is constituted only of the unit formed from the monomer represented by the formula (4) (fluorine-containing acrylic segment). Further, the copolymer is constituted of the fluorine-containing acrylic segment and the unit formed from the monomer represented by the formula (5) (fluorine-free acrylic segment).

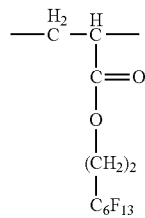

Formula (16)

The composition ratio of the fluorine-containing acrylic segment to the fluorine-free acrylic segment in the fluorine-containing acrylic copolymer (molar ratio) is preferably set to 1:99 to 90:10 from the viewpoints of liquid-repellent properties. In addition, in order to provide high liquid-repellent properties, the content of the fluorine-containing acrylic segment in the copolymer is preferably 30 mol % or more. It should be noted that the content may be identified by using GC/MS.

The weight-average molecular weight of each of the homopolymer and the copolymer may be set to, for example, 10,000 or more and 500,000 or less. When the weight-average molecular weight is 10,000 or more, the aggregation of the silane compound having a perfluoropolyether group can be more certainly suppressed. When the weight-average molecular weight is 500,000 or less, the patterning of the liquid-repellent film can be easily performed.

Production Method for Homopolymer and Production Method for Copolymer

Production methods for the fluorine-containing acrylic homopolymer and copolymer to be used in the present invention, for each of which a generally used polymerization method may be appropriately used, are not particularly limited. In Examples and Comparative Examples to be described later, with the use of the above-mentioned monomers represented by the chemical formulae (11) to (15), solution polymerization was performed in the presence of a polymerization initiator (azobisisobutyronitrile (AIBN)) to produce each polymer. Specifically, first, predetermined amounts of the fluorine-containing acrylate monomer and the fluorine-free acrylate monomer, methyl isobutyl ketone (MIBK), and AIBN were loaded into a flask, and subjected to nitrogen bubbling for about 10 minutes. After that, the inside of the flask was heated to 75° C., and the contents were stirred while additional AIBN was loaded. After a predetermined period of time, the reaction solution, which had been cooled to room temperature, was poured into methanol, and the precipitate was washed with methanol several times. After that, the precipitate was dissolved in 2,2,2-trifluoroethanol, precipitated with methanol, and subjected to vacuum drying (60° C., 10 hours or more) to produce each polymer.

<Production Method for Liquid-Repellent Film>

The liquid-repellent film of the present invention may be produced by, for example, a production method including the following steps:

the step of providing a mixture containing any one of the silane compounds having a perfluoropolyether group represented by the formulae (1) to (3), and the above-mentioned fluorine-containing acrylic homopolymer (defined as a first mixture); and the step of providing a liquid-repellent film which is a solidified product of this mixture.

Alternatively, the liquid-repellent film of the present invention may be produced by, for example, a production method including the following steps:

the step of providing a mixture containing any one of the silane compounds having a perfluoropolyether group represented by the formulae (1) to (3), and the above-mentioned fluorine-containing acrylic copolymer (defined as a second mixture); and the step of providing a liquid-repellent film which is a solidified product of this mixture.

It should be noted that each of the first and second mixtures may contain a solvent. Accordingly, the first and second mixtures can be first and second application liquids for forming the liquid-repellent film, respectively. Further, the first mixture may be formed of any one of the silane compounds having a perfluoropolyether group represented by the formulae (1) to (3) and the above-mentioned fluorine-containing acrylic homopolymer. In this case, the liquid-repellent film may be formed of the first mixture. Similarly, the second mixture may be formed of any one of those silane compounds, and the above-mentioned fluorine-containing acrylic copolymer. In this case, the liquid-repellent film may be formed of the second mixture.

Examples of a solvent in the first and second application liquids for forming the liquid-repellent film include solvents having a fluorine atom in its molecular structure such as a hydrofluorocarbon, a perfluorocarbon, a hydrofluoroether, a hydrofluoropolyether, and a perfluoropolyether. Of those, at least one of hydrofluoroethers represented by the following chemical formulae (6), (17), and (18) is desirably used as the solvent from the viewpoint of solubility. In addition, a solvent represented by the formula (6) that has the highest boiling point is more desirably used from the viewpoint of application property.

$$HCF_2CF_2CF_2\text{—}CH(CH_3)O\text{—}CF_2CF_2CF_2H \quad \text{Formula (6)}$$

$$C_4F_9OCH_3 \quad \text{Formula (17)}$$

$$C_4F_9OC_2H_5 \quad \text{Formula (18)}$$

Commercially available products of those hydrofluoroethers include fluorine-based solvents Novec HFE7100, HFE7200, and HFE7600 (all of which are trade names, manufactured by Sumitomo 3M Limited).

It should be noted that as a method of removing the solvent in the mixture to form a solidified product (liquid-repellent film), there may be given, for example, heating treatment (e.g., temperature: 70° C., time: 3 minutes) and vacuum drying.

<Fine Structure and Production Method Therefor>

A fine structure using the liquid-repellent film of the present invention and a production method therefor are described below. It should be noted that the fine structure means a structure having a nano-order or micron-order pattern. The fine structure is formed on a substrate, and has the liquid-repellent film of the present invention, for example, on the surface of the fine structure. Examples of the fine structure may include a flow path member in an ink jet recording head to be described later, and members for forming a color filter, element, and wiring in a display. However, the fine structure is not limited thereto.

The production method for the fine structure of the present invention may include the following steps, and may be utilized in the production of an ink jet recording head to be described later:
i) the step of forming, on a substrate, a photo cationic polymerizable resin layer which contains a photo cationic polymerizable resin material and is uncured;
ii) the step of forming, on the photo cationic polymerizable resin layer, the liquid-repellent film of the present invention; and
iii) the step of subjecting the photo cationic polymerizable resin layer and the liquid-repellent film to pattern exposure and development to remove a non-exposed portion of the photo cationic polymerizable resin layer and a non-exposed portion of the liquid-repellent film, thereby forming a fine pattern.

It should be noted that the fine pattern means a nano-order or micron-order pattern, and examples thereof may include the shape of an ink ejection orifice in a flow path member to be described later, and patterns of a color filter, element, and wiring in a display.

<Ink Jet Recording Head>

FIG. 1 is a perspective view of an example of an ink jet recording head having a fine structure of the present invention. The recording head has a flow path member 2 formed on a substrate 1 having multiple energy-generating elements 5 for ejecting ink. The flow path member 2 has an ink ejection orifice 3 for ejecting ink, and an ink flow path 6 communicating with the ink ejection orifice 3 and holding ink. Further, the flow path member 2 is constituted of two layers, and on the surface of a photo cationic polymerizable resin layer (cured product), a liquid-repellent film of the present invention is formed. Further, the substrate 1 is provided with an ink supply port 4 for supplying ink to an ink flow path 6.

<Production Method for Ink Jet Recording Head>

With reference to FIGS. 2A to 2D, a production method for the ink jet recording head having a fine structure of the present invention is described. It should be noted that FIGS. 2A to 2D are views for illustrating the production method for the ink jet recording head, and FIGS. 2A to 2D are process cross-sectional views corresponding to a cross-section taken along the line 2A-2A of FIG. 1.

First, on the element substrate 1 having the energy-generating element 5 formed thereon, a pattern material 8 to serve as a bubbling chamber is formed. Next, on the element substrate, more specifically, on the element substrate 1 and the pattern material 8, a photo cationic polymerizable resin layer 7a which contains a photo cationic polymerizable resin material and is uncured is formed (step i).

For example, a silicon substrate having a crystal orientation of a (100) plane may be used as a substrate to be used for the element substrate 1. Further, for example, an electrothermal converting element or a piezoelectric element may be used as the energy-generating element. It should be noted that the pattern material and the photo cationic polymerizable resin layer may be formed directly on the surface of the element substrate 1, or another layer (e.g., an adhesion layer) may be formed between the element substrate 1 and those layers. A material for the pattern material is not particularly limited as long as it is a positive resist capable of being solubilized in a developer through light irradiation. A vinyl ketone polymer compound of photodegradation type, such as a polymethyl isopropenyl ketone or a polyvinyl ketone, or an acrylic polymer compound of photodegradation type can be suitably used. Examples of the acrylic polymer compound of photodegradation type include: a copolymer of methacrylic acid and methyl methacrylate; and a copolymer of methacrylic acid, methyl methacrylate, and methacrylic anhydride.

In addition, an epoxy resin composition of cationic polymerizable type may be suitably used as the photo cationic polymerizable resin material. Particularly, an epoxy resin composition of photo cationic polymerizable type based on an epoxy resin such as: an epoxy resin of bisphenol A type, an epoxy resin of phenol novolac type, an epoxy resin of cresol novolac type and a polyfunctional epoxy resin having an oxycyclohexane skeleton is suitably used. The epoxy resin composition may contain a photo cationic polymerization initiator, an additive, or the like. With the use of the epoxy resin having two or more epoxy functional groups for the photo cationic polymerizable resin material, the cured product can be three-dimensionally crosslinked, which is suitable for obtaining desired characteristics. Further, the photo cationic polymerizable resin layer 7a may be formed of any such photo cationic polymerizable resin material.

After that, an application liquid (e.g., an application liquid formed of the above-mentioned silane compound, polymer, and solvent) for forming the liquid-repellent film of the present invention is applied onto the photo cationic polymerizable resin layer 7a. After that, heating treatment for removing the solvent in the application liquid is performed as required. Thus, a liquid-repellent film 7b is formed (step ii, FIG. 2A).

The blending ratios (parts by mass) of the silane compound having a perfluoropolyether group and the polymer (fluorine-containing acrylic homopolymer or copolymer) in the application liquid are particularly preferably set to be equal amounts from the viewpoint of the suppression of the aggregation of the silane compound having a perfluoropolyether group. Further, in order to easily provide sufficient liquid-repellent properties, the concentration (solid content concentration) in the application liquid is preferably 0.01 mass % or more and 5.0 mass % or less, more preferably 0.05 mass % or more and 1.0 mass % or less.

Figure 2A:
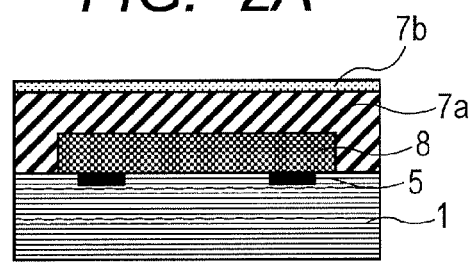
FIGS. 2A, 2B, 2C and 2D are process views for illustrating a production method for the ink jet recording head having the fine structure of the present invention.
Figure 2B:
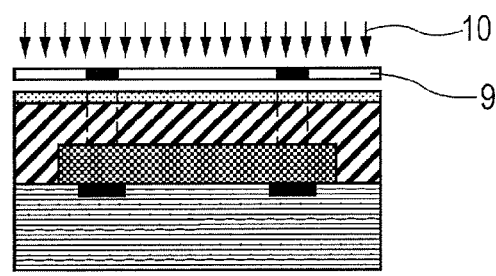
Figure 2C:
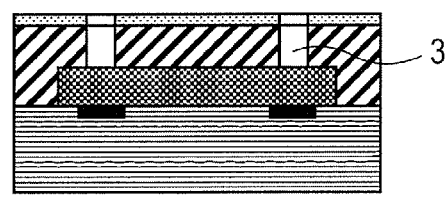

Next, regions to be cured of the photo cationic polymerizable resin layer 7a and the liquid-repellent film 7b are irradiated with ultraviolet light 10 with the use of a mask 9, i.e., subjected to pattern exposure (exposure step, FIG. 2B). In Examples to be described later, the exposure was performed monochromatically with the i-line as the ultraviolet light 10. Next, the development step is performed. Specifically, a non-exposed portion of the resin layer 7a and a non-exposed portion of the liquid-repellent film 7b are removed with the use of a developer (e.g., a mixed liquid of MIBK and xylene). Thus, the ink ejection orifice 3 (fine pattern) is formed (step iii, FIG. 2C).

Figure 2D:
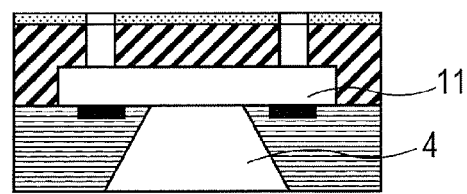

Next, on the back surface of the element substrate (the surface of the two opposed surfaces of the element substrate on the side where the flow path member is not formed), a mask (not shown) for producing the ink supply port is appropriately disposed, and the surface of the element substrate 1 is protected with a rubber film (not shown). After that, the ink supply port 4 penetrating through the element substrate is produced by, for example, anisotropic etching of the Si substrate. After the completion of the etching, the rubber film is removed, and the pattern material 8 is dissolved and removed with the use of a solvent (e.g., methyl lactate) to form an ink flow path communicating with the ejection orifice (e.g., a bubbling chamber 11) (FIG. 2D). In order to completely cure the photo cationic polymerizable resin layer, a heating process (e.g., heating treatment at 200° C. for 1 hour) is performed as required. After that, electrical wiring and an ink supply unit are appropriately disposed to provide an ink jet recording head (not shown).

EXAMPLES

Example 1

As illustrated in FIGS. 2A to 2D, an ink jet recording head was produced.

Specifically, first, on the silicon substrate 1 having the energy-generating element 5 formed thereon, the pattern material 8 formed of a polymethyl isopropenyl ketone (manufactured by TOKYO OHKA KOGYO CO., LTD., trade name: ODUR-1010) was formed. Next, a solution constituted of the materials shown in Table 1 was applied onto the silicon substrate and the pattern material to form the photo cationic polymerizable resin layer 7a which was uncured (step i).

TABLE 1

| Epoxy resin | EHPE-3150 (trade name, manufactured by Daicel Chemical Industries, Ltd.) | 100 parts by mass |

TABLE 1-continued

| Additive | 1,4-HFAB (trade name, manufactured by Central Glass Co., Ltd.) | 20 parts by mass |
| Photo cationic polymerization initiator | SP-172 (trade name, manufactured by ADEKA CORPORATION) | 6 parts by mass |
| Silane coupling agent | A-187 (trade name, manufactured by GE Toshiba Silicone) | 5 parts by mass |
| Solvent | Xylene (trade name, manufactured by KISHIDA CHEMICAL Co., Ltd.) | 70 parts by mass |

Next, an application liquid (liquid-repellent material solution) formed of the following materials was applied onto the resin layer. It should be noted that the blending amounts of the silane compound and the homopolymer in the application liquid were set to be equal amounts (parts by mass), and the solid content concentration in the application liquid was set to 0.2 mass %.

Silane Compound having Perfluoropolyether Group
Silane compound represented by formula (8) (in the formula (8), u is 20 and n is 3)
Fluorine-Containing Acrylic Homopolymer
Homopolymer of monomer represented by formula (11) (weight-average molecular weight: 30,000)
Solvent (Fluorine-Based Solvent)
Trade name: Novec HFE7600 (trade name, manufactured by Sumitomo 3M Limited).

After that, the solvent in the application liquid was removed by heating at 70° C. for 3 minutes to form the liquid-repellent film 7b (step ii). That is, the liquid-repellent film is formed of a mixture of the silane compound and the homopolymer. Next, regions to be cured of the photo cationic polymerizable resin layer and the liquid-repellent layer were irradiated with the i-line with the use of the mask 9, and non-exposed portions of the resin layer and the liquid-repellent film were removed with the use of a developer (mixed liquid of MIBK and xylene) to form the ink ejection orifice 3 as a fine pattern (step iii).

Next, a mask was disposed on the back surface of the substrate, and the surface of the substrate was protected with a rubber film. After that, the ink supply port 4 passing through the element substrate was produced by anisotropic etching of the Si substrate. After the completion of the etching, the rubber film was removed, and the pattern material 8 was dissolved and removed with the use of a solvent (methyl lactate) to form an ink flow path communicating with the ejection orifice. In addition, heating treatment was performed at 200° C. for 1 hour to further cure the photo cationic polymerizable resin layer, and electrical wiring and an ink supply unit were appropriately disposed to produce an ink jet recording head.

Evaluations
Initial Liquid-Repellent Properties

The initial liquid-repellent properties of the liquid-repellent film were evaluated by measuring the dynamic receding contact angle θr of the surface of the ink jet recording head (surface of the liquid-repellent film) with respect to pure water with an automatic contact angle meter (Kyowa Interface Science Co., Ltd., trade name: CA-W), and evaluating the value of the dynamic receding contact angle with respect to pure water according to the following criteria:
A: 100° or more;
B: less than 100° and 85° or more;
C: less than 85° and 75° or more; and
D: less than 75°.

Liquid-Repellent Properties after Immersion in Ink

Liquid-repellent properties after immersion in ink were evaluated by immersing the ink jet recording head in an ink commercially available under the trade name "BCI-7C" from Canon Inc. at a temperature of 60° C. for 1 week, measuring the θr of the surface of the ink jet recording head after the immersion with respect to pure water, and evaluating the θr according to the following criteria:

A: 80° or more;
B: less than 80° and 70° or more;
C: less than 70° and 60° or more; and
D: less than 60°.

Aggregation

The presence or absence of the aggregation of a liquid-repellent material (silane compound) in the liquid-repellent film was confirmed with a color 3D laser microscope (trade name: VD-9710, manufactured by KEYENCE CORPORATION).

Example 2

An ink jet recording head was produced in the same manner as in Example 1 except that a homopolymer of the monomer represented by the formula (12) (weight-average molecular weight: 30,000) was used as the fluorine-containing acrylic homopolymer.

Examples 3 and 4

Ink jet recording heads were produced in the same manner as in Examples 1 and 2, respectively, except that the silane compound represented by the formula (9) was used as the silane compound having a perfluoropolyether group. It should be noted that v in the formula (9) is 20.

Examples 5 and 6

Ink jet recording heads were produced in the same manner as in Examples 1 and 2, respectively, except that the silane compound represented by the formula (10) was used as the silane compound having a perfluoropolyether group. It should be noted that w in the formula (10) is 20 and e therein is 10.

Examples 7 to 12

Ink jet recording heads were each produced in the same manner as in Example 2 except that silane compounds represented by the following formulae (19) to (24) were each used as the silane compound having a perfluoropolyether group.

$$F-(CF_2CF_2CF_2O)_{20}-CF_2CF_2-[CH_2CH(Si(OCH_3)_2CH_3)]_3-H \quad \text{Formula (19)}$$

$$F-(CF_2CF_2CF_2O)_{20}-CF_2CF_2-[CH_2CH(SiOCH_3(CH_3)_2)]_3-H \quad \text{Formula (20)}$$

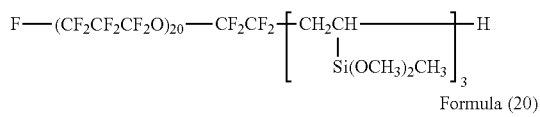
Formula (21)

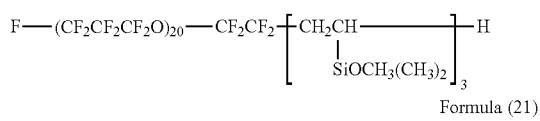
Formula (22)

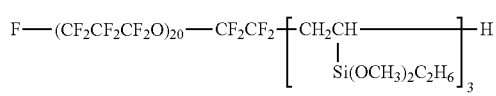
Formula (23)

$$F-(CF_2CF_2CF_2O)_{20}-CF_2CF_2-[CH_2CH(Si(OC_3H_7)_3)]_3-H \quad \text{Formula (24)}$$

Example 13

An ink jet recording head was produced in the same manner as in Example 1 except that a copolymer of the monomer represented by the formula (11) and the monomer represented by the formula (13) (weight-average molecular weight: 50,000) was used in place of the fluorine-containing acrylic homopolymer of Example 1. It should be noted that g in the formula (13) is 20. Further, the composition ratio of a segment derived from the monomer represented by the formula (11) to a segment derived from the monomer represented by the formula (13) in the copolymer was set to 30:70.

Examples 14 and 15

Ink jet recording heads were produced in the same manner as in Example 13 except that the composition ratio of the segment derived from the monomer represented by the formula (11) to the segment derived from the monomer represented by the formula (13) in the copolymer of Example 13 was changed to 50:50 and 80:20, respectively. It should be noted that the weight-average molecular weights of the copolymers used in Examples 14 and 15 were 30,000 and 20,000, respectively.

Examples 16 to 18

Ink jet recording heads were produced in the same manner as in Examples 13 to 15 except that the monomer represented by the formula (13) used for forming the copolymer of each of Examples 13 to 15 was changed to the monomer represented by the formula (14). It should be noted that the weight-average molecular weights of the copolymers used in Examples 16 to 18 were 100,000, 60,000, and 40,000, respectively.

Examples 19 to 21

Ink jet recording heads were produced in the same manner as in Examples 13 to 15 except that the monomer represented by the formula (13) used for forming the copolymer of each of Examples 13 to 15 was changed to the monomer represented by the formula (15). It should be noted that the weight-average molecular weights of the copolymers used in Examples 19 to 21 were 100,000, 60,000, and 40,000, respectively.

Examples 22 to 30

Ink jet recording heads were produced in the same manner as in Examples 13 to 21 except that the monomer represented by the formula (11) used for forming the copolymer of each of Examples 13 to 21 was changed to the monomer represented by the formula (12). It should be noted that the weight-average molecular weights of the copolymers used in Examples 22 to 30 were the same as those of Examples 13 to 21, respectively.

Examples 31 and 32

Ink jet recording heads were produced in the same manner as in Examples 13 and 15 except that the silane compound represented by the formula (8) used in each of Examples 13 and 15 was changed to the silane compound represented by the formula (9). It should be noted that v in the formula (9) represents 20.

Examples 33 and 34

Ink jet recording heads were produced in the same manner as in Examples 16 and 18 except that the silane compound represented by the formula (8) used in each of Examples 16 and 18 was changed to the silane compound represented by the formula (9). It should be noted that v in the formula (9) is 20.

Examples 35 and 36

Ink jet recording heads were produced in the same manner as in Examples 19 and 21 except that the silane compound represented by the formula (8) used in each of Examples 19 and 21 was changed to the silane compound represented by the formula (9). It should be noted that v in the formula (9) is 20.

Examples 37 to 42

Ink jet recording heads were produced in the same manner as in Examples 31 to 36 except that the monomer represented by the formula (11) used for forming the copolymer of each of Examples 31 to 36 was changed to the monomer represented by the formula (12). It should be noted that the weight-average molecular weights of the copolymers used in Examples 37 to 42 were the same as those of Examples 31 to 36, respectively.

Examples 43 to 54

Ink jet recording heads were produced in the same manner as in Examples 31 to 42 except that the silane compound having a perfluoropolyether group in each example was changed from the silane compound represented by the formula (9) to the silane compound represented by the formula (10). It should be noted that w in the formula (10) is 20 and e therein is 10.

Examples 55 and 56

Ink jet recording heads were produced in the same manner as in Examples 28 and 30 except that the silane compound represented by the formula (8) used in each of Examples 28 and 30 was changed to the silane compound represented by the formula (19).

Examples 57 and 58

Ink jet recording heads were produced in the same manner as in Examples 28 and 30 except that the silane compound represented by the formula (8) used in each of Examples 28 and 30 was changed to the silane compound represented by the formula (20).

Examples 59 and 60

Ink jet recording heads were produced in the same manner as in Examples 28 and 30 except that the silane compound represented by the formula (8) used in each of Examples 28 and 30 was changed to the silane compound represented by the formula (21).

Examples 61 and 62

Ink jet recording heads were produced in the same manner as in Examples 28 and 30 except that the silane compound represented by the formula (8) used in each of Examples 28 and 30 was changed to the silane compound represented by the formula (22).

Examples 63 and 64

Ink jet recording heads were produced in the same manner as in Examples 28 and 30 except that the silane compound represented by the formula (8) used in each of Examples 28 and 30 was changed to the silane compound represented by the formula (23).

Examples 65 and 66

Ink jet recording heads were produced in the same manner as in Examples 28 and 30 except that the silane compound represented by the formula (8) used in each of Examples 28 and 30 was changed to the silane compound represented by the formula (24).

Comparative Examples 1 to 9

Ink jet recording heads were produced in the same manner as in Examples 1, 3, 5, and 7 to 12, respectively, except that no fluorine-containing acrylic homopolymer was blended in the application liquid.

Comparative Examples 10 and 11

Ink jet recording heads were produced in the same manner as in Examples 1 and 2, respectively, except that no silane compound having a perfluoropolyether group was blended in the application liquid.

Comparative Examples 12 to 29

Ink jet recording heads were produced in the same manner as in Examples 13 to 30, respectively, except that no silane compound having a perfluoropolyether group was blended in the application liquid.

Tables 2 and 3 show the chemical formula numbers of the silane compounds having a perfluoropolyether group used in Examples and Comparative Examples, the chemical formula numbers of the monomers used for forming the fluorine-containing acrylic homopolymers used therein, the chemical formula numbers of the monomers used for forming the respective segments of the fluorine-containing acrylic copolymers used therein, and the composition ratios (molar ratios) of the segments. Table 2 and Table 3 show the results of the evaluations of the produced ink jet recording heads as well.

TABLE 2

| Example | Silane compound (formula) | Homo-polymer (formula) | Copolymer Fluorine-containing acrylic segment (formula) | Fluorine-free acrylic segment (formula) | Composition ratio* (molar-ratio) | Aggregation | Initial liquid-repellent properties | Liquid-repellent properties after immersion in ink |
|---|---|---|---|---|---|---|---|---|
| 1 | (8) | (11) | | — | | Absent | A | A |
| 2 | | (12) | | | | | A | A |
| 3 | (9) | (11) | | | | | A | B |
| 4 | | (12) | | | | | A | B |
| 5 | (10) | (11) | | | | | B | B |
| 6 | | (12) | | | | | B | B |
| 7 | (19) | | | | | | A | A |
| 8 | (20) | | | | | | A | B |
| 9 | (21) | | | | | | A | A |
| 10 | (22) | | | | | | A | B |
| 11 | (23) | | | | | | A | A |
| 12 | (24) | | | | | | A | B |
| 13 | (8) | — | (11) | (13) | 30/70 | | A | A |
| 14 | | | | | 50/50 | | A | A |
| 15 | | | | | 80/20 | | A | A |
| 16 | | | | (14) | 30/70 | | A | A |
| 17 | | | | | 50/50 | | A | A |
| 18 | | | | | 80/20 | | A | A |
| 19 | | | | (15) | 30/70 | | A | A |
| 20 | | | | | 50/50 | | A | A |
| 21 | | | | | 80/20 | | A | A |
| 22 | | | (12) | (13) | 30/70 | | A | A |
| 23 | | | | | 50/50 | | A | A |
| 24 | | | | | 80/20 | | A | A |
| 25 | | | | (14) | 30/70 | | A | A |
| 26 | | | | | 50/50 | | A | A |
| 27 | | | | | 80/20 | | A | A |
| 28 | | | | (15) | 30/70 | | A | A |
| 29 | | | | | 50/50 | | A | A |
| 30 | | | | | 80/20 | | A | A |
| 31 | (9) | | (11) | (13) | 30/70 | | B | B |
| 32 | | | | | 80/20 | | A | B |
| 33 | | | | (14) | 30/70 | | B | B |
| 34 | | | | | 80/20 | | A | B |
| 35 | | | | (15) | 30/70 | | B | B |
| 36 | | | | | 80/20 | | A | B |
| 37 | | | (12) | (13) | 30/70 | | B | B |
| 38 | | | | | 80/20 | | A | B |
| 39 | | | | (14) | 30/70 | | B | B |
| 40 | | | | | 80/20 | | A | B |
| 41 | | | | (15) | 30/70 | | B | B |
| 42 | | | | | 80/20 | | A | B |
| 43 | (10) | | (11) | (13) | 30/70 | | B | B |
| 44 | | | | | 80/20 | | B | B |
| 45 | | | | (14) | 30/70 | | B | B |
| 46 | | | | | 80/20 | | B | B |
| 47 | | | | (15) | 30/70 | | B | B |
| 48 | | | | | 80/20 | | B | B |
| 49 | | | (12) | (13) | 30/70 | | B | B |
| 50 | | | | | 80/20 | | B | B |
| 51 | | | | (14) | 30/70 | | B | B |
| 52 | | | | | 80/20 | | B | B |
| 53 | | | | (15) | 30/70 | | B | B |
| 54 | | | | | 80/20 | | B | B |
| 55 | (19) | | (12) | (15) | 30/70 | | A | A |
| 56 | | | | | 80/20 | | A | A |
| 57 | (20) | | | | 30/70 | | A | B |
| 58 | | | | | 80/20 | | A | B |
| 59 | (21) | | | | 30/70 | | A | A |
| 60 | | | | | 80/20 | | A | A |
| 61 | (22) | | | | 30/70 | | A | B |
| 62 | | | | | 80/20 | | A | B |
| 63 | (23) | | | | 30/70 | | A | A |
| 64 | | | | | 80/20 | | A | A |
| 65 | (24) | | | | 30/70 | | A | B |
| 66 | | | | | 80/20 | | A | B |

*Composition ratio of fluorine-containing acrylic segment/fluorine-free acrylic segment

TABLE 3

| Comparative Example | Silane compound (formula) | Homo-polymer (formula) | Copolymer Fluorine-containing acrylic segment (formula) | Copolymer Fluorine-free acrylic segment (formula) | Composition ratio** (molar-ratio) | Aggregation | Initial liquid-repellent properties | Liquid-repellent properties after immersion in ink |
|---|---|---|---|---|---|---|---|---|
| 1 | (8) | | | | | Present | A | A |
| 2 | (9) | | | | | | A | B |
| 3 | (10) | | | | | | A | B |
| 4 | (19) | | | | | | A | A |
| 5 | (20) | | | | | | A | B |
| 6 | (21) | | | | | | A | A |
| 7 | (22) | | | | | | A | B |
| 8 | (23) | | | | | | A | A |
| 9 | (24) | | | | | | A | B |
| 10 | — | (11) | | — | | Absent | A | D |
| 11 | | (12) | | | | | A | D |
| 12 | | — | (11) | (13) | 30/70 | | C | D |
| 13 | | | | | 50/50 | | B | D |
| 14 | | | | | 80/20 | | A | D |
| 15 | | | | (14) | 30/70 | | C | D |
| 16 | | | | | 50/50 | | B | D |
| 17 | | | | | 80/20 | | A | D |
| 18 | | | | (15) | 30/70 | | C | D |
| 19 | | | | | 50/50 | | B | D |
| 20 | | | | | 80/20 | | A | D |
| 21 | | | (12) | (13) | 30/70 | | C | D |
| 22 | | | | | 50/50 | | B | D |
| 23 | | | | | 80/20 | | A | D |
| 24 | | | | (14) | 30/70 | | C | D |
| 25 | | | | | 50/50 | | B | D |
| 26 | | | | | 80/20 | | A | D |
| 27 | | | | (15) | 30/70 | | C | D |
| 28 | | | | | 50/50 | | B | D |
| 29 | | | | | 80/20 | | A | D |

**Composition ratio of fluorine-containing acrylic segment/fluorine-free acrylic segment Tables 2 and 3 showed that the ink jet recording heads produced in Examples 1 to 66 each had a large initial θr, confirming that the ink jet recording heads exhibited satisfactory liquid-repellent properties. Further, even after the immersion in ink, no significant reduction in θr was observed. In addition, the aggregation of the liquid-repellent material was not confirmed. Those ink jet recording heads were subjected to a printing evaluation, and as a result, exhibited high printing quality with no print dot misalignment or the like observed.

According to the present invention, the liquid-repellent film in which the aggregation of a liquid-repellent material is suppressed and which is excellent in liquid-repellent properties and the production method therefor can be provided. The fine structure using the liquid-repellent film and the production method therefor can also be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-032687, filed on Feb. 17, 2012, which is hereby incorporated by reference herein in its entirety.

What is claimed is:
1. A liquid-repellent film, comprising:
   any one of silane compounds having a perfluoropolyether group represented by the following formulae (1), (2), and (3); and
   a fluorine-containing acrylic homopolymer which is a homopolymerized product of a monomer represented by the following formula (4):

$$Rf^{I}\text{-}X^{I}\text{—}SiR^{I}_{a}Y^{I}_{3-a} \qquad \text{Formula (1)}$$

in the formula (1), $Rf^{I}$ represents a perfluoropolyether group, $R^{I}$ represents a hydrolyzable substituent, $X^{I}$ represents an organic group having 1 or more and 12 or less carbon atoms, $Y^{I}$ represents a non-hydrolyzable substituent, and a represents an integer of 1 or more and 3 or less;

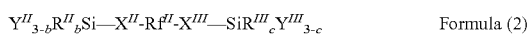
$$Y^{II}_{3-b}R^{II}_{b}Si\text{—}X^{II}\text{-}Rf^{II}\text{-}X^{III}\text{—}SiR^{III}_{c}Y^{III}_{3-c} \qquad \text{Formula (2)}$$

in the formula (2), $Rf^{II}$ represents a perfluoropolyether group, $R^{II}$ and $R^{III}$ each independently represent a hydrolyzable substituent, $X^{II}$ and $X^{III}$ each independently represent an organic group having 1 or more and 12 or less carbon atoms, $Y^{II}$ and $Y^{III}$ each independently represent a non-hydrolyzable substituent, and b and c each independently represent an integer of 1 or more and 3 or less;

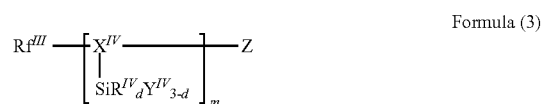
$$Rf^{III}\text{—}\left[\begin{array}{c} X^{IV}\text{—} \\ | \\ SiR^{IV}_{d}Y^{IV}_{3-d} \end{array}\right]_{m}\text{—}Z \qquad \text{Formula (3)}$$

in the formula (3), $Rf^{III}$ represents a perfluoropolyether group, $R^{IV}$ represents a hydrolyzable substituent, $X^{IV}$ represents a linear saturated hydrocarbon group having 1 or more and 12 or less carbon atoms, $Y^{IV}$ represents a non-hydrolyzable substituent, Z represents a hydrogen atom or an alkyl group, d represents an integer of 1 or more and 3 or less, and m represents a positive integer, provided that $-\text{SiR}^{IV}_d Y^{IV}_{3-d}$ is bonded to a terminal carbon atom on a Z side in $X^{IV}$; and

$$\text{CH}_2=\text{CA}^I\text{-C}(=\text{O})-\text{O-A}^{II}\text{-Rf}^{IV} \quad \text{Formula (4)}$$

in the formula (4), $A^I$ represents H or $CH_3$, $A^{II}$ represents a linear saturated hydrocarbon group having 1 or more and 3 or less carbon atoms, and $Rf^{IV}$ represents a linear or branched perfluoroalkyl group.

2. A liquid-repellent film according to claim 1, wherein the perfluoropolyether group in the silane compound having a perfluoropolyether group contained in the liquid-repellent film has a structure represented by the following formula (7):

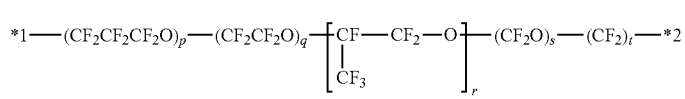
$$*1-(CF_2CF_2CF_2O)_p-(CF_2CF_2O)_q-\left[\begin{array}{c}CF-CF_2-O\\|\\CF_3\end{array}\right]_r-(CF_2O)_s-(CF_2)_t-*2 \quad \text{Formula (7)}$$

in the formula (7), p, q, r, s, and t each independently represent an integer of 0 or more, provided that a sum of p, q, r, and s is 2 or more, and *1 and *2 each independently represent a fluorine atom, or represent a bonding site with the organic group having 1 or more and 12 or less carbon atoms or the linear saturated hydrocarbon group having 1 or more and 12 or less carbon atoms, provided that at least one of *1 and *2 represents a bonding site with the organic group having 1 or more and 12 or less carbon atoms or the linear saturated hydrocarbon group having 1 or more and 12 or less carbon atoms.

3. A liquid-repellent film according to claim 1, wherein a weight-average molecular weight of the perfluoropolyether group in the silane compound having a perfluoropolyether group contained in the liquid-repellent film is 500 or more and 20,000 or less.

4. A liquid-repellent film, comprising:
any one of silane compounds having a perfluoropolyether group represented by the following formulae (1), (2), and (3); and
a fluorine-containing acrylic copolymer which is a copolymerized product of a monomer represented by the following formula (4) and a monomer represented by the following formula (5):

$$\text{Rf}^I\text{-X}^I-\text{SiR}^I_a Y^I_{3-a} \quad \text{Formula (1)}$$

in the formula (1), $Rf^I$ represents a perfluoropolyether group, $R^I$ represents a hydrolyzable substituent, $X^I$ represents an organic group having 1 or more and 12 or less carbon atoms, $Y^I$ represents a non-hydrolyzable substituent, and a represents an integer of 1 or more and 3 or less;

$$Y^{II}_{3-b}R^{II}_b\text{Si}-X^{II}\text{-Rf}^{II}\text{-}X^{III}-\text{SiR}^{III}_c Y^{III}_{3-c} \quad \text{Formula (2)}$$

in the formula (2), $Rf^{II}$ represents a perfluoropolyether group, $R^{II}$ and $R^{III}$ each independently represent a hydrolyzable substituent, $X^{II}$ and $X^{III}$ each independently represent an organic group having 1 or more and 12 or less carbon atoms, $Y^{II}$ and $Y^{III}$ each independently represent a non-hydrolyzable substituent, and b and c each independently represent an integer of 1 or more and 3 or less;

$$\text{Rf}^{III}-\left[X^{IV}\begin{array}{c}|\\\text{SiR}^{IV}_d Y^{IV}_{3-d}\end{array}\right]_m-Z \quad \text{Formula (3)}$$

in the formula (3), $Rf^{III}$ represents a perfluoropolyether group, $R^{IV}$ represents a hydrolyzable substituent, $X^{IV}$ represents a linear saturated hydrocarbon group having 1 or more and 12 or less carbon atoms, $Y^{IV}$ represents a non-hydrolyzable substituent, Z represents a hydrogen atom or an alkyl group, d represents an integer of 1 or more and 3 or less, and m represents a positive integer, provided that $-\text{SiR}^{IV}_d Y^{IV}_{3-d}$ is bonded to a terminal carbon atom on a Z side in $X^{IV}$;

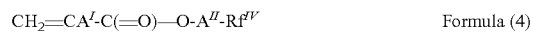
$$\text{CH}_2=\text{CA}^I\text{-C}(=\text{O})-\text{O-A}^{II}\text{-Rf}^{IV} \quad \text{Formula (4)}$$

in the formula (4), $A^I$ represents H or $CH_3$, $A^{II}$ represents a linear saturated hydrocarbon group having 1 or more and 3 or less carbon atoms, and $Rf^{IV}$ represents a linear or branched perfluoroalkyl group; and

$$\text{CH}_2=\text{CA}^{III}\text{-C}(=\text{O})-\text{O-A}^{IV} \quad \text{Formula (5)}$$

in the formula (5), $A^{III}$ represents H or $CH_3$, and $A^{IV}$ represents an alkyl group having 1 or more and 30 or less carbon atoms or a group having an oxirane ring.

5. A liquid-repellent film according to claim 4, wherein a content of a unit formed from the monomer represented by the formula (4) in the fluorine-containing acrylic copolymer is 30 mol % or more.

6. A liquid-repellent film according to claim 4, wherein the perfluoropolyether group in the silane compound having a perfluoropolyether group contained in the liquid-repellent film has a structure represented by the following formula (7):

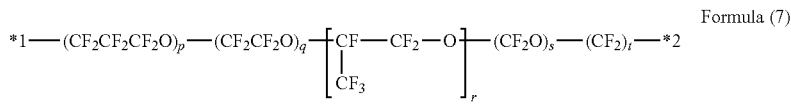
$$*1-(CF_2CF_2CF_2O)_p-(CF_2CF_2O)_q-\left[\begin{array}{c}CF-CF_2-O\\|\\CF_3\end{array}\right]_r-(CF_2O)_s-(CF_2)_t-*2 \quad \text{Formula (7)}$$

in the formula (7), p, q, r, s, and t each independently represent an integer of 0 or more, provided that a sum of p, q, r, and s is 2 or more, and *1 and *2 each independently represent a fluorine atom, or represent a bonding site with the organic group having 1 or more and 12 or less carbon atoms or the linear saturated hydrocarbon group having 1 or more and 12 or less carbon atoms, provided that at least one of *1 and *2 represents a bonding site with the organic group having 1 or more and 12 or less carbon atoms or the linear saturated hydrocarbon group having 1 or more and 12 or less carbon atoms.

7. A liquid-repellent film according to claim 4, wherein a weight-average molecular weight of the perfluoropolyether group in the silane compound having a perfluoropolyether group contained in the liquid-repellent film is 500 or more and 20,000 or less.

\* \* \* \* \*